(12) United States Patent
Han et al.

(10) Patent No.: US 11,569,330 B2
(45) Date of Patent: Jan. 31, 2023

(54) ARRAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Linhong Han, Beijing (CN); Shikai Qin, Beijing (CN); Tingliang Liu, Beijing (CN); Youngyik Ko, Beijing (CN); Binyan Wang, Beijing (CN); Tiaomei Zhang, Beijing (CN); Hao Zhang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 197 days.

(21) Appl. No.: 16/911,274

(22) Filed: Jun. 24, 2020

(65) Prior Publication Data
US 2021/0193772 A1 Jun. 24, 2021

(30) Foreign Application Priority Data
Dec. 20, 2019 (CN) .......................... 201911323149.2

(51) Int. Cl.
*H01L 27/32* (2006.01)
*G02F 1/136* (2006.01)
(Continued)

(52) U.S. Cl.
CPC .......... *H01L 27/3276* (2013.01); *G02F 1/136* (2013.01); *G09G 3/3225* (2013.01); *G09G 3/3266* (2013.01); *G09G 3/3275* (2013.01)

(58) Field of Classification Search
None
See application file for complete search history.

(56) References Cited

U.S. PATENT DOCUMENTS 10,580,803 B2   3/2020 Bei et al.
2019/0051670 A1  2/2019 Bei et al.
(Continued)

FOREIGN PATENT DOCUMENTS

CN   207123683 U   3/2018
CN   107911507 A   4/2018
(Continued)

OTHER PUBLICATIONS

First Chinese Office Action dated Mar. 31, 2021, received for corresponding Chinese Application No. 201911323149.2, 19 pages.

*Primary Examiner* — Ryan Crockett
(74) *Attorney, Agent, or Firm* — Kinney & Lange, P.A.

(57) ABSTRACT

An array substrate is provided, including: a base substrate including a display area; a racetrack hole portion in the display area, including: a long axis; a short axis; a first hole and a second hole; a frame area surrounding the first hole and the second hole; and multiple lines in the frame area. The frame area includes a first wiring area and a second wiring area, the first wiring area includes a first conductive layer, and the multiple lines located in the first wiring area are arranged in the first conductive layer; and the second wiring area includes a second conductive layer and a third conductive layer arranged in different layers, and some of the multiple lines located in the second wiring area are arranged in the second conductive layer, and other lines of the multiple lines located in the second wiring area are arranged in the third conductive layer.

13 Claims, 5 Drawing Sheets

(51) Int. Cl.
*G09G 3/3225* (2016.01)
*G09G 3/3266* (2016.01)
*G09G 3/3275* (2016.01)

(56) References Cited

U.S. PATENT DOCUMENTS

| | | | | |
|---|---|---|---|---|
| 2019/0362678 | A1* | 11/2019 | Shin | H01L 27/124 |
| 2020/0064968 | A1* | 2/2020 | Kim | H01L 27/3276 |
| 2020/0236259 | A1* | 7/2020 | Nakamura | G02F 1/133512 |
| 2021/0013298 | A1 | 1/2021 | Her et al. | |

FOREIGN PATENT DOCUMENTS

| | | |
|---|---|---|
| CN | 207460353 U | 6/2018 |
| CN | 108449450 A | 8/2018 |
| CN | 108807426 A | 11/2018 |
| CN | 109143645 A | 1/2019 |
| CN | 109521594 A | 3/2019 |
| CN | 109686762 A | 4/2019 |
| CN | 110515247 A | 11/2019 |
| EP | 4002342 A1 * | 5/2022 |
| KR | 1020130027335 A | 3/2013 |
| WO | 2019199139 A | 10/2019 |

\* cited by examiner

ARRAY SUBSTRATE AND DISPLAY DEVICE

CROSS-REFERENCE TO RELATED APPLICATION

This application claims the benefit of Chinese Patent Application No. 201911323149.2 filed on Dec. 20, 2019 in the National Intellectual Property Administration of China, the whole disclosure of which is incorporated herein by reference.

TECHNICAL FIELD

The present disclosure relates to the field of display technology, and more particularly, to an array substrate and a display device.

BACKGROUND

With the increasing demand for beautiful appearance of display terminals, a mobile phone display screen tends to frameless direction. However, a front camera hole and a sensor hole may occupy a part of the space. One method is to use a bang screen or a water drop screen, the other method is to open a hole in the display area, that is, to place the camera hole and the sensor hole in the display area. Generally, the camera hole and the sensor hole are separated round holes or square holes. In order to ensure the yield and display effect of the display product, a frame area around the round hole and a frame area around the square hole are set to have the same safe distance.

SUMMARY

According to an aspect of the present disclosure, an array substrate is provided, including: a base substrate including a display area; and a racetrack hole portion in the display area, including: a long axis; a short axis; a first hole and a second hole spaced apart in a long axis direction of the racetrack hole portion; a frame area surrounding the first hole and the second hole; and multiple lines in the frame area, wherein an orthographic projection of a combination of the first hole, the second hole, and the frame area on the base substrate has a racetrack shape; the frame area includes a first wiring area and a second wiring area, a width of the first wiring area in the long axis direction of the racetrack hole portion is greater than a width of the second wiring area in the long axis direction of the racetrack hole; the first wiring area includes a first conductive layer, and a plurality of lines located in the first wiring area are arranged in the first conductive layer; and the second wiring area includes a second conductive layer and a third conductive layer which are arranged in different layers, and a part of a plurality of lines located in the second wiring area are arranged in the second conductive layer, and the other part of the plurality of lines located in the second wiring area are arranged in the third conductive layer.

According to some exemplary embodiments, the frame area includes: a first frame area on a side of the first hole away from the second hole; a second frame area between the first hole and the second hole; and a third frame area on a side of the second hole away from the first hole.

According to some exemplary embodiments, the first wiring area is located in the first frame area, and the second wiring area is located in the second frame area; or the second wiring area is located in the first frame area, and the first wiring area is located in the second frame area; or the second wiring area is located in each of the first frame area and the second frame area.

According to some exemplary embodiments, the first wiring area or the second wiring area is further located in the third frame area.

According to some exemplary embodiments, the array substrate further includes a plurality of pixel units in the display area, wherein the plurality of pixel units include thin film transistors, each of the thin film transistors including an active layer, a gate electrode, a source electrode, and a drain electrode.

According to some exemplary embodiments, the first conductive layer is located on the same layer as the gate electrode, and the second conductive layer is located on the same layer as the source electrode and the drain electrode.

According to some exemplary embodiments, the material of the third conductive layer is the same as the material of the source electrode and the drain electrode.

According to some exemplary embodiments, the first conductive layer is located on the same layer as the source electrode and the drain electrode, and the second conductive layer is located on the same layer as the gate electrode.

According to some exemplary embodiments, the material of the third conductive layer is the same as the material of the gate electrode.

According to some exemplary embodiments, orthographic projections of the plurality of lines located in the first wiring area on the base substrate are spaced apart from each other by a first distance; orthographic projections of the plurality of lines located in the second wiring area on the base substrate are spaced apart from each other by a second distance; and the first distance is greater than the second distance.

According to some exemplary embodiments, a plurality of lines arranged in the second conductive layer and a plurality of lines arranged in the third conductive layer are alternately arranged.

According to some exemplary embodiments, the first hole is an irregular-shaped hole, and the second hole is a regular-shaped hole.

According to some exemplary embodiments, the irregular-shaped hole includes an arc portion and a rectangular portion, and an inner diameter of the arc portion in a short axis direction is the same as an inner diameter of the rectangular portion in the short axis direction.

According to some exemplary embodiments, the first hole includes: a stepped portion on an edge of the first hole in the long axis direction.

According to another aspect of the present disclosure, a display device including the array substrate as described above is provided.

According to some exemplary embodiments, the display device further includes one or more functional devices, wherein the functional devices include a camera or a sensor, and an orthographic projection of the functional devices on the base substrate falls into an orthographic projection of the racetrack hole portion on the base substrate.

According to some exemplary embodiments, at least two functional devices are arranged in the first hole, and at least one functional device is arranged in the second hole.

BRIEF DESCRIPTION OF THE DRAWINGS

In order to more clearly explain the technical solutions in the embodiments of the present disclosure, the drawings required in the description of the embodiments will be briefly introduced below. Obviously, the drawings in the following description are only some embodiments of the present disclosure. For those of ordinary skill in the art, without paying any creative work, other drawings can be obtained based on these drawings.

DETAILED DESCRIPTION OF EMBODIMENTS

Figure 1:
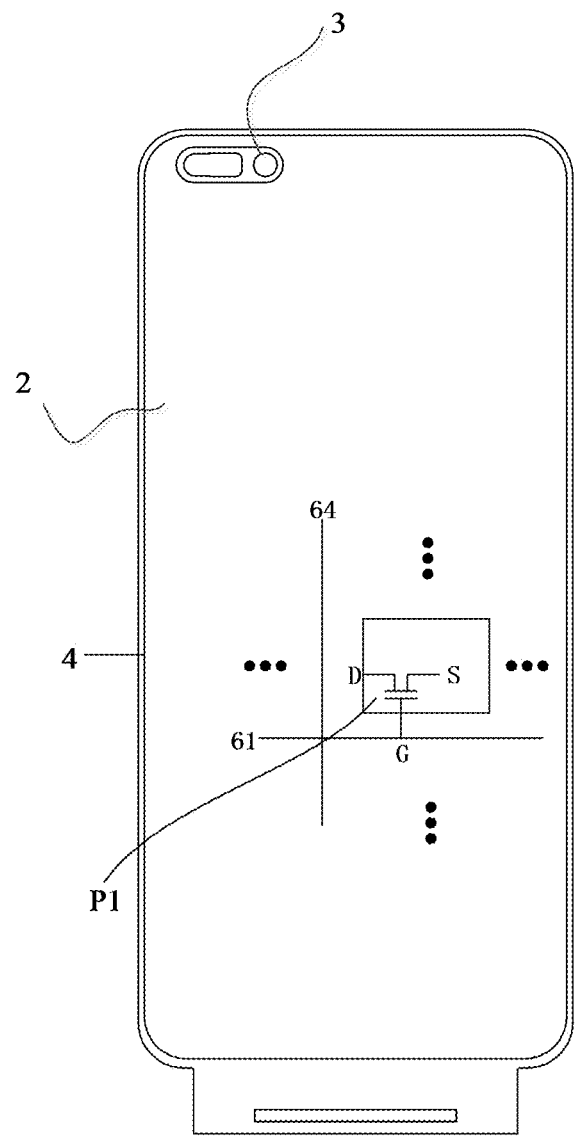
FIG. 1 shows a schematic plan view of a display device according to some exemplary embodiments of the present disclosure.

In order to explain the disclosure more clearly, the present disclosure will be further described below in conjunction with exemplary embodiments and drawings. Similar parts in the drawings are denoted by the same reference numerals. Those skilled in the art should understand that the content specifically described below is illustrative rather than restrictive, and should not be used to limit the protection scope of the present disclosure.

As shown in FIG. 1, embodiments of the present disclosure provide at least a display device that includes an array substrate 1. The array substrate 1 includes: a base substrate 4 that includes a display area 2; a racetrack hole portion 3 provided in the display area 2; a plurality of pixel units P1 provided in the display area 2, wherein the plurality of pixel units P1 are electrically connected to a plurality of scan lines 61 and a plurality of data lines 64, and the plurality of pixel units P1 include thin film transistors, each of which includes a gate electrode G, a source electrode S, and a drain electrode D.

Figure 2:
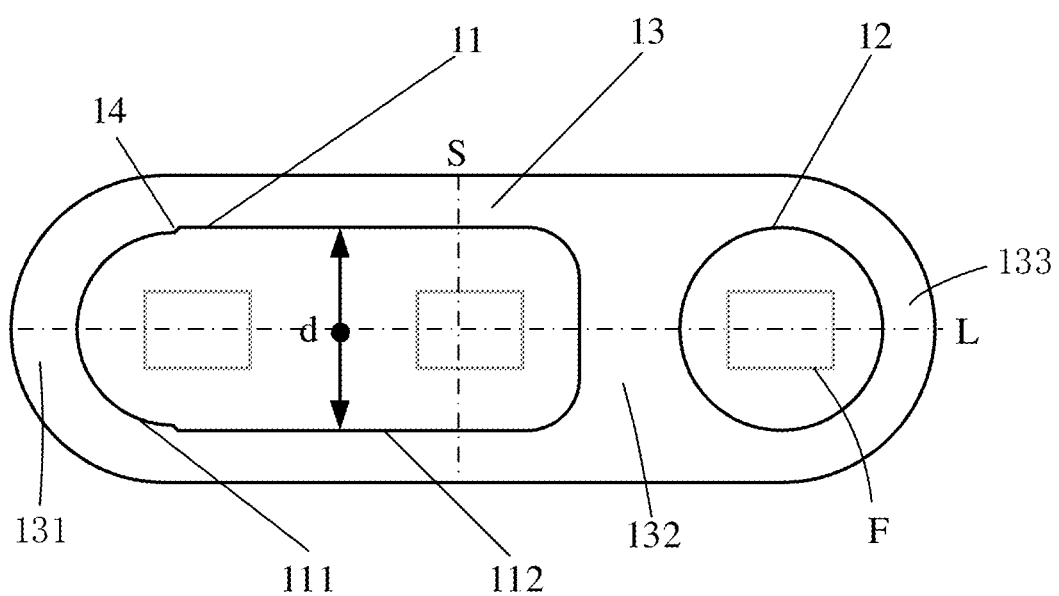
FIG. 2 shows a schematic structural view of a racetrack hole portion of an array substrate according to some exemplary embodiments of the present disclosure.

In some embodiments, the display device includes one or more functional devices F, and the functional devices include a camera or a sensor. As shown in FIG. 2, an orthographic projection of the functional devices F on the base substrate 4 falls into an orthographic projection of the racetrack hole portion 3 on the base substrate 4.

In a specific example, as shown in FIG. 2, the racetrack hole portion 3 includes: a long axis L; a short axis S; a first hole 11 and a second hole 12 provided in a long axis direction, wherein the first hole 11 and the second hole 12 are spaced apart in the long axis direction of the racetrack hole portion 3; and a frame area 13 surrounding the first hole 11 and the second hole 12. An orthographic projection of a combination of the first hole 11, the second hole 12 and the frame area 13 on the base substrate 4 has a racetrack shape.

It should be noted that, an expressions "long axis" and "short axis" herein represent imaginary line segments, rather than solid axes. For example, it should be understood that in an ellipse, the long axis is the longest line segment that may be obtained by connecting two points on the ellipse, the short axis is the line connecting two vertices in the ellipse that are closer together, and the short axis bisects the long axis vertically. Similarly, in the racetrack shape herein, the long axis is the longest line segment that may be obtained by connecting two points on the racetrack shape, the short axis is the line connecting two vertices in the racetrack shape that are closer together, and the short axis bisects the long axis vertically.

In some embodiments, the first hole 11 is an irregular-shaped hole, such as a non-circular hole, a non-rectangular hole, a non-triangular hole, or a non-regular polygon hole; and the second hole 12 is a regular-shaped hole, such as a circular hole, a rectangular hole, a triangular hole, or a regular polygonal hole.

In some embodiments, the first hole 11 includes an arc portion 111 and a rectangular portion 112. An inner diameter of the arc portion 111 in a short axis direction is the same as an inner diameter of the rectangular portion 112 in the short axis direction. Alternatively, the inner diameter of the arc portion 111 in the short axis direction is different from the inner diameter of the rectangular portion 112 in the short axis direction.

In a specific example, as shown in FIG. 2, the frame area 13 includes: a first frame area 131 located on a side of the first hole away from the second hole; a second frame area 132 located between the first hole and the second hole; and the third frame area 133 located on a side of the second hole away from the first hole.

Figure 3A:
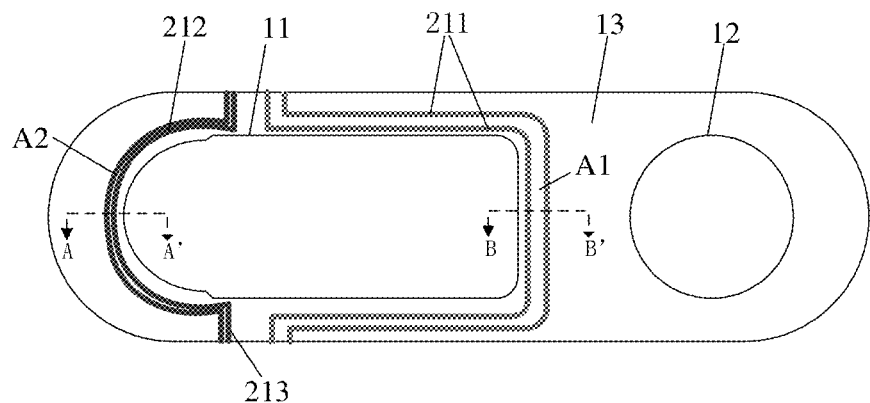
FIG. 3A shows a schematic view of each wiring area in a racetrack hole portion according to some exemplary embodiments of the present disclosure.
Figure 3B:
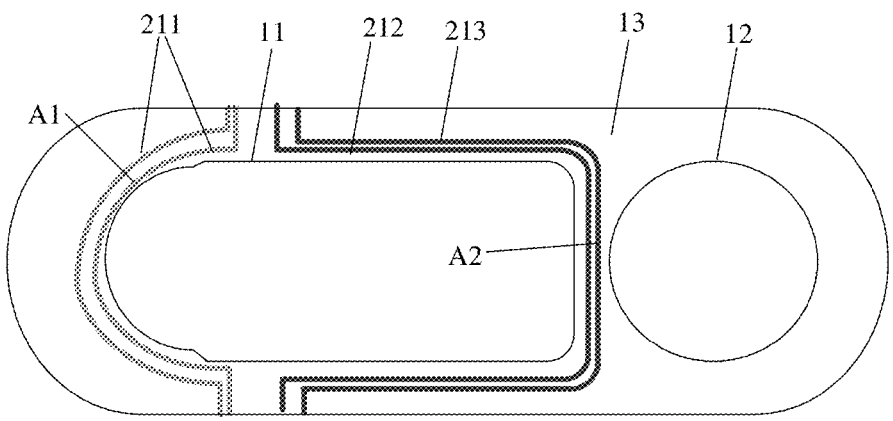
FIG. 3B shows a schematic view of each wiring area in a racetrack hole portion according to some exemplary embodiments of the present disclosure.

The racetrack hole portion in the display area does not emit light, that is, there is no pixel unit in the racetrack hole portion, but there are lines connecting the pixel units, especially there are multiple lines between the first hole 11 and the second hole 12. In an optional embodiment, as shown in FIG. 3A or FIG. 3B, in order to ensure that signals can be transmitted on the multiple lines in the area of the racetrack hole portion 3, the frame area 13 includes a first wiring area A1 and a second wiring area A2, wherein a wiring width of the first wiring area A1 in the long axis direction of the racetrack hole portion 3 is greater than a wiring width of the second wiring area A2 in the long axis direction of the racetrack hole portion 3.

In this embodiment, different wiring areas are provided in the frame area to realize the wiring of the required lines, so as to avoid short circuit between metal lines due to an excessively small area of the frame area and excessive wiring. It is to be noted that the wiring width not only features the size of the wiring area, but also features whether the number of lines in the wiring area and a spacing between the lines meet a safe distance of the wiring. Those skilled in the art should choose appropriate wiring areas according to the actual wiring needs to avoid the short circuit, and to ensure the safe transmission of signals as a design criterion, which will not described in detail here.

In some embodiments, the first wiring area A1 includes a first conductive layer, and multiple lines located in the first wiring area A1 are arranged in the first conductive layer. The second wiring area A2 includes a second conductive layer and a third conductive layer, and the second conductive layer and the third conductive layer are arranged in different layers. A part of the multiple lines located in the second wiring area A2 are arranged in the second conductive layer, and the other part of the multiple lines located in the second wiring area A2 are arranged in the third conductive layer.

In some embodiments, the first wiring area A1 is located in the first frame area 131, and the second wiring area A2 is located in the second frame area 132. Alternatively, the second wiring area A2 is located in the first frame area 131, and the first wiring area A1 is located in the second frame area 132. Alternatively, the second wiring area A2 is located in each of the first frame area 131 and the second frame area 132.

In this embodiment, different wiring areas are provided according to the size of the frame area 13 of the racetrack hole portion 3 and the number of lines. As shown in FIG. 3A, the wiring width of the second frame area 132 between the first hole 11 and the second hole 12 is larger than the wiring width of the first frame area 131. Accordingly, the second frame area 132 is provided with the first wiring area A1 therein, that is, first lines 211 are arranged in the first conductive layer. In other words, all the first lines 211 are arranged in the same layer.

In addition, the first frame area 131 with smaller wiring width is provided with the second wiring area A2 therein, that is, second lines 212 and third lines 213 are arranged in different layers, for example, arranged in the second conductive layer and the third conductive layer, respectively. In other words, in the case of the wiring width is not enough for wiring in the same layer, two different layers are used to realize the wiring of the lines, that is, the signals are transmitted through the second lines 212 and the third lines 213 in different layers, respectively, to ensure a safe distance between multiple lines.

In the case of the wiring width of the frame area is relatively small, two or more conductive layers may be provided to arrange lines in different layers. Different signals are transmitted in different layers to ensure a safe distance between lines, thereby ensuring the stable and accurate transmission of the signals.

In an optional embodiment, the first conductive layer is located in the same layer as the gate electrode in the pixel unit of the array substrate, and the second conductive layer is located in the same layer as the source electrode and the drain electrode in the pixel unit of the array substrate, and the material of the third conductive layer is the same as the material of the source electrode and the drain electrode. In this embodiment, the first conductive layer uses Ti/Al/Ti alloy, and the second conductive layer and the third conductive layer use Mo.

In an optional embodiment, the first conductive layer is located in the same layer as the source electrode and the drain electrode in the pixel unit of the array substrate; the second conductive layer is located in the same layer as the gate electrode in the pixel unit of the array substrate, and the material of the third conductive layer is the same as the material of the gate electrode. Although the second conductive layer and the third conductive layer are arranged in different layers, the second conductive layer and the third conductive layer use the same material, so the loss of the transmitted signal is the same, thereby achieving indistinguishable transmission of the transmitted signal.

In a specific embodiment, the second frame area 132 with a smaller wiring width is provided with the second wiring area A2 therein, as shown in FIG. 3B, thereby solving the signal transmission problem when the wiring width of the second frame area 132 is smaller.

Figure 3C:
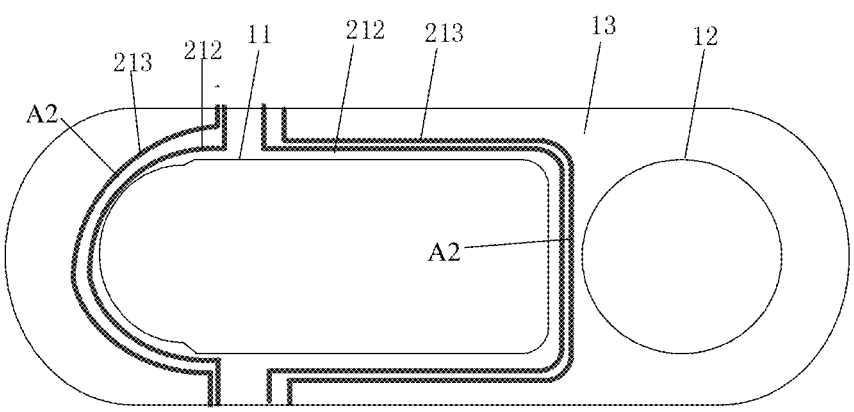
FIG. 3C shows a schematic view of each wiring area in a racetrack hole portion according to some exemplary embodiments of the present disclosure.

In another specific embodiment, the first frame area 131 and the second frame area 132, which both have a smaller wiring width, are both provided with the second wiring area A2 therein, as shown in FIG. 3C, thereby solving the signal transmission problem when the wiring width on both sides of the first hole is small.

In an optional embodiment, both the first frame area 131 and the second frame area 132 may be provided with the second line area A2 therein, that is, four conductive layers may be used for signals transmission at the same time, which is not limited in the present disclosure, those skilled in the art should select appropriate wiring areas according to actual application requirements to achieve stable and safe signal transmission as a design criterion, which will not described in detail here.

In an optional embodiment, the third frame area 133 is provided with a first wiring area or a second wiring area.

In this embodiment, the third frame area 133 may be provided with a first wiring area or a second wiring area. Those skilled in the art should select appropriate wiring areas according to the specific area of the third frame area 133 and the number of lines to meet the design criteria of safe, stable and accurate transmission of each transmitted signal, which will not described in detail here.

For example, each pixel unit P1 in the plurality of pixel units P1 may have a pixel driving circuit for controlling the sub-pixel unit to emit light.

Hereinafter, a structure of the pixel driving circuit is described in detail by taking the 7T1C pixel driving circuit as an example. However, the embodiments of the present disclosure are not limited to the 7T1C pixel driving circuit. In the case of no conflict, other known pixel driving circuit structures may be applied to the embodiments of the present disclosure.

Figure 4:
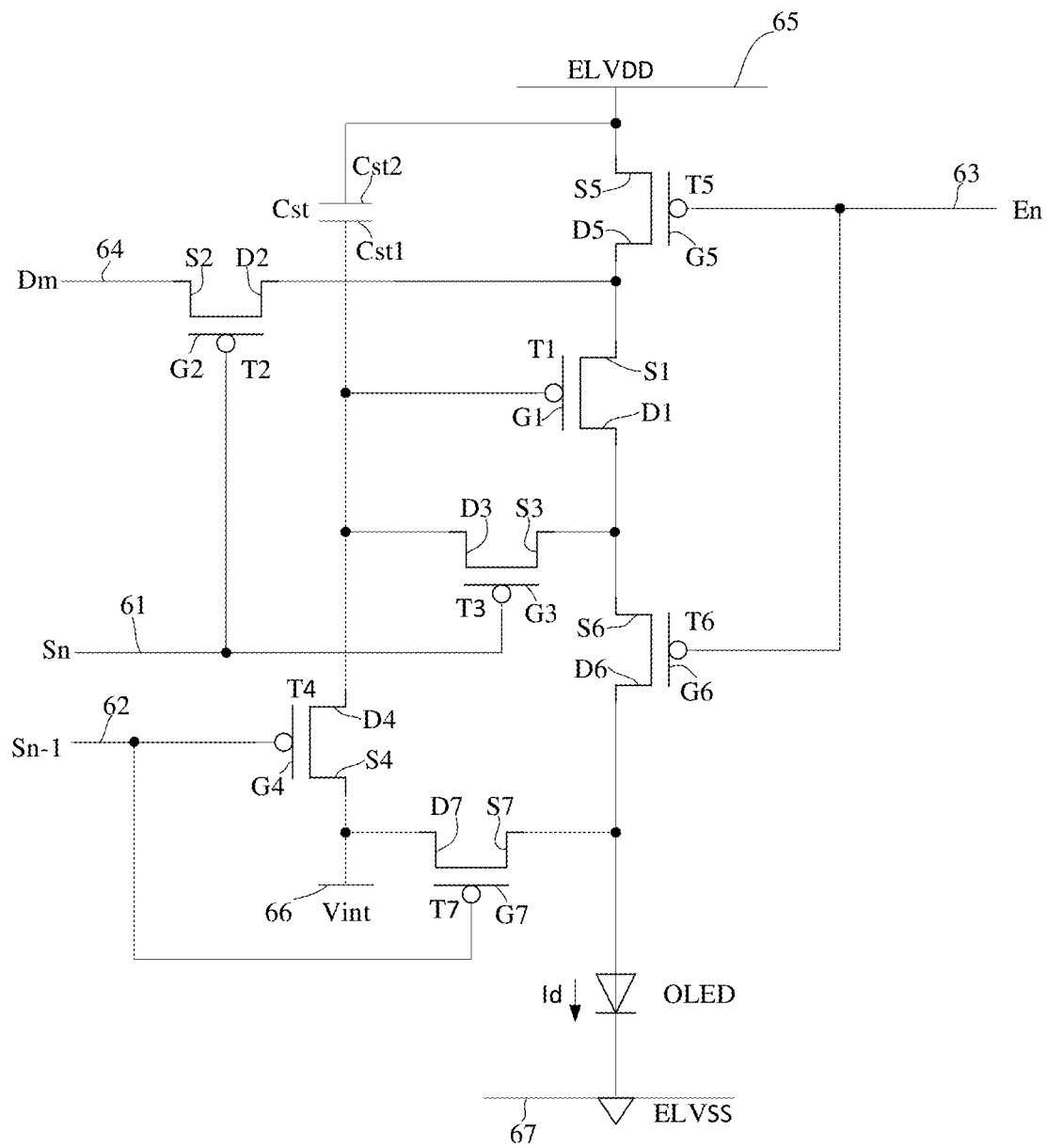
FIG. 4 shows an equivalent circuit diagram of one pixel driving circuit of a display device according to some exemplary embodiments of the present disclosure.

FIG. 4 is an equivalent circuit diagram of one pixel driving circuit of a display panel according to some exemplary embodiments of the present disclosure. As shown in FIG. 4, the pixel driving circuit may include: a plurality of signal lines 61, 62, 63, 64, 65, 66 and 67, a plurality of thin film transistors T1, T2, T3, T4, T5, T6 and T7, and a storage capacitor Cst. The pixel driving circuit is configured to drive an organic light emitting diode (i.e., OLED).

The plurality of thin film transistors include a driving thin film transistor T1, a switching thin film transistor T2, a compensation thin film transistor T3, an initialization thin film transistor T4, an operation control thin film transistor T5, an emission control thin film transistor T6, and a bypass thin film transistor T7.

The plurality of signal lines include: a scan signal line 61 to deliver a scan signal Sn, a previous scan signal line 62 to deliver a previous scan signal Sn-1 to the initialization thin film transistor T4, an emission control line 63 to deliver an emission control signal En to the operation control thin film transistor T5 and the emission control thin film transistor T6, a data line 64 to deliver a data signal Dm, a driving voltage line 65 to deliver a driving voltage ELVDD, an initialization voltage line 66 to deliver an initialization voltage Vint for initializing the driving thin film transistor T1, and a power supply line 67 to deliver an ELVSS voltage.

The driving thin film transistor T1 includes a gate electrode G1 electrically connected to one end (hereinafter referred to as a first capacitor electrode Cst1) of the storage capacitor Cst. A source electrode S1 of the driving thin film transistor T1 is electrically connected to the driving voltage line 65 via the operation controlling thin film transistor T5, and a drain electrode D1 of the thin film transistor T1 is electrically connected to an anode of the OLED via the emission control thin film transistor T6. The driving thin film transistor T1 receives the data signal Dm according to a switching operation by the switching thin film transistor T2 so as to supply a driving current Id to the OLED.

The switching thin film transistor T2 includes a gate electrode G2 electrically connected to the scan signal line 61. A source electrode S2 of the switching thin film transistor T2 is electrically connected to the data line 64, and a drain electrode D2 of the switching thin film transistor T2 is electrically connected to the driving voltage line 65 via the operation controlling thin film transistor T5, and to the source electrode S1 of the driving thin film transistor T1. The switching thin film transistor T2 is turned on according to the scan signal Sn received via the scan signal line 64 and performs a switching operation to deliver the data signal Dm form the data line 64 to the source electrode S1 of the driving thin film transistor T1.

The compensation thin film transistor T3 includes a gate electrode G3 electrically connected to the scan signal line 61. A source electrode S3 of the compensation thin film transistor T3 is electrically connected to the anode of the OLED via the emission control thin film transistor T6, and to the drain electrode D1 of the driving thin film transistor T1. A drain electrode D3 of the compensation thin film transistor T3 is electrically connected to one end (i.e., the first capacitor electrode Cst1) of the storage capacitor Cst, a drain electrode D4 of the initialization thin film transistor T4, and the gate electrode G1 of the driving thin film transistor T1. The compensation thin film transistor T3 is turned on according to the scan signal Sn from the scan signal line 61 to electrically connect the gate electrode G1 and the drain electrode D1 of the driving thin film transistor T1, thereby placing the driving thin film transistor T1 in a diode-connected state.

The initialization thin film transistor T4 includes a gate electrode G4 electrically connected to the previous scan signal line 62. A source electrode S4 of the initialization thin film transistor T4 is electrically connected to the initialization voltage line 66, and a drain electrode D4 of the initialization thin film transistor T4 is electrically connected to one end Cst1 of the storage capacitor Cst, the drain electrode D3 of the compensation thin film transistor T3, and the gate electrode G1 of the driving thin film transistor T1. The initialization thin film transistor T4 is turned on according to the previous scan signal Sn-1 from the previous scan signal line 62 to deliver the initialization voltage Vint to the gate electrode G1 of the driving thin film transistor T1, thereby performing an initialization operation to initialize a voltage of the gate electrode G1 of the driving thin film transistor T1.

The operation control thin film transistor T5 includes a gate electrode G5 electrically connected to the emission control line 63. A source electrode S5 of the operation control thin film transistor T5 is electrically connected to the driving voltage line 65, and a drain electrode D5 of the operation control thin film transistor T5 is electrically connected to the source electrode S1 of the driving thin film transistor T1 and the drain electrode D2 of the switching thin film transistor T2.

The emission control thin film transistor T6 includes a gate electrode G6 electrically connected to the emission control line 63. A source electrode S6 of the emission control thin film transistor T6 is electrically connected to the drain electrode D1 of the driving thin film transistor T1 and the source electrode S3 of the compensation thin film transistor T3, and a drain electrode D6 of the emission control thin film transistor T6 is electrically connected to the anode of the OLED. The operation control thin film transistor T5 and the emission control thin film transistor T6 are turned on concurrently (for example, simultaneously) according to the emission control signal En from the emission control line 63 to deliver the driving voltage ELVDD to the OLED, thereby allowing the driving current Id to flow to the OLED.

The bypass thin film transistor T7 includes: a gate electrode G7 connected to the previous scan signal line 62; a source electrode S7 connected to the drain electrode D6 of the emission control thin film transistor T6 and the anode of the OLED; and a drain electrode D7 connected to the initialization voltage line 66. The bypass thin film transistor T7 delivers the previous scan signal Sn-1 from the previous scan signal line 62 to the gate electrode G7.

The other end (hereinafter referred to as a second capacitor electrode Cst2) of the storage capacitor Cst is electrically connected to the driving voltage line 65, and a cathode of the OLED is electrically connected to the power supply line 67 to receive the common voltage ELVSS. Accordingly, the OLED receives the driving current Id from the driving thin film transistor T1 to emit light, thereby displaying an image.

It should be noted that, in FIG. 4, each of the thin film transistors T1, T2, T3, T4, T5, T6, and T7 has a single-gate electrode structure. However, the embodiments of the present disclosure are not limited thereto, and at least some of the thin film transistors T1, T2, T3, T4, T5, T6 and T7 may have a dual-gate electrode structure. In FIG. 4, the respective thin film transistors T1, T2, T3, T4, T5, T6, and T7 are p-channel field effect transistors, but the embodiments of the present disclosure are not limited thereto, and at least some of the thin film transistors T1, T2, T3, T4, T5, T6 and T7 may be n-channel field effect transistors.

In operation, during an initialization period, the previous scan signal Sn-1 having a low level is supplied via the previous scan signal line 62. Then, the initialization thin film transistor T4 is turned on based on the low level of the previous scan signal Sn-1 and the initialization voltage Vint from the initialization voltage line 66 is delivered to the gate electrode G1 of the driving thin film transistor T1 via the initialization thin film transistor T4. Thus, the driving thin film transistor T1 is initialized due to the initialization voltage Vint.

During a data programming period, the scan signal Sn having a low level is supplied via the scan signal line 61. Then, the switching thin film transistor T2 and the compensation thin film transistor T3 are turned on based on the low level of the scan signal Sn. Accordingly, as the compensation thin-film transistor T3 is turned on, the driving thin film transistor T1 is placed in a diode-connected state and is biased in a forward direction.

Then, a compensation voltage Dm+Vth (e.g., Vth is a negative value), obtained by subtracting a threshold voltage Vth of the driving thin film transistor T1 from the data signal Dm supplied via the data line 64, is applied to the gate electrode G1 of the driving thin film transistor T1. Then, the driving voltage ELVDD and the compensation voltage Dm+Vth are applied to both ends of the storage capacitor Cst, so that charges corresponding to a voltage difference between the respective terminals are stored in the storage capacitor Cst.

During an emission period, an emission control signal En from the emission control line 63 is changed from a high level to a low level. Then, during the emission period, the operation control thin film transistor T5 and the emission control thin film transistor T6 are turned on based on the low level of the emission control signal En.

Then, the driving current is generated based on a difference between a voltage of the gate electrode G1 of the thin film transistor T1 and the driving voltage ELVDD. The driving current Id corresponding to a difference between the driving current and a bypass current, is supplied to the OLED via the emission control thin film transistor T6.

During the emission period, a gate-source voltage of the driving thin film transistor T1 is maintained at (Dm+Vth)-ELVDD due to the storage capacitor Cst, based on the current-voltage relation of the driving thin film transistor T1. The drive current Id is proportional to $(Dm-ELVDD)^2$. Thus, the driving current Id is determined regardless of the threshold voltage Vth of the driving thin film transistor T1.

Optionally, the first line 211, the second line 212 and the third line 213 may include the data line 64 described above. Specifically, referring back to FIG. 1, the data line 64 extending in the vertical direction may connect the pixel units P1 arranged on the upper side of the racetrack hole portion 3 and the pixel units P1 arranged on the lower side of the racetrack hole portion 3. In this way, the data line 64 is necessary to extend through the frame area included in the racetrack hole portion 3.

It should be noted that, those skilled in the art should understand that the above implementation is only exemplary, and the first line 211, the second line 212 and the third line 213 may include at least some of the signal lines 61, 62, 63, 64, 65, 66 and 67.

Figure 5A:
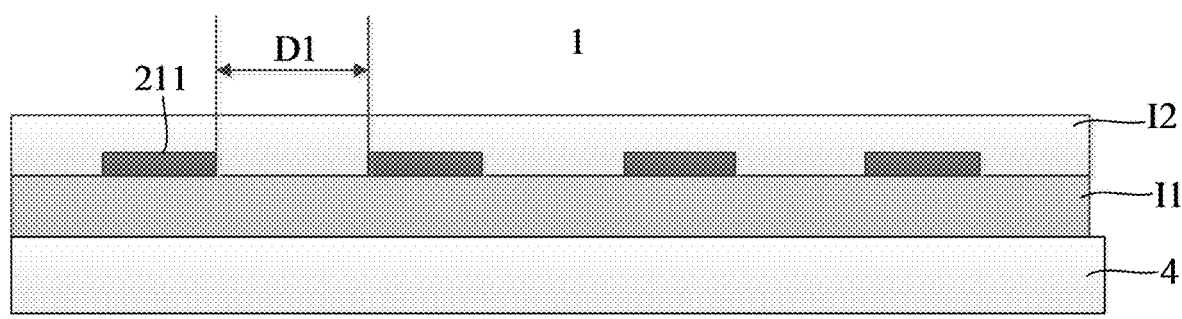
FIG. 5A shows a schematic cross-sectional view of a racetrack hole portion taken along line BB' in FIG. 3A according to some exemplary embodiments of the present disclosure.
Figure 5B:
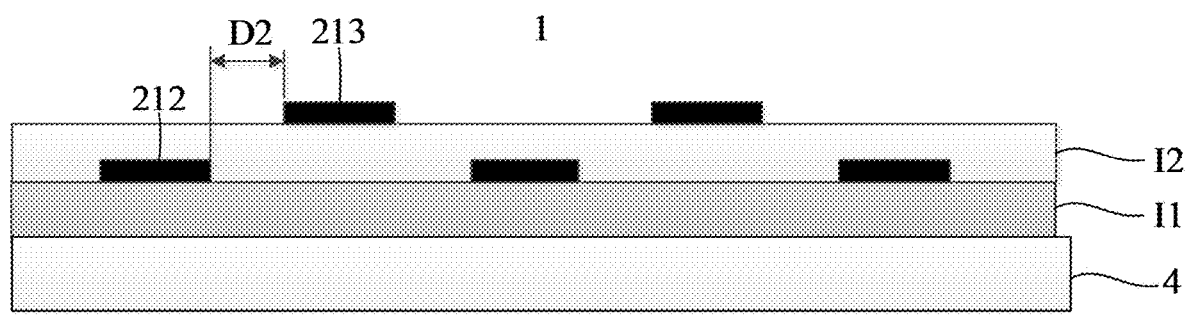
FIG. 5B shows a schematic cross-sectional view of the racetrack hole portion taken along line AA' in FIG. 3A according to some exemplary embodiments of the present disclosure.

FIGS. 5A and 5B show schematic cross-sectional views of the racetrack hole portion 3 taken along line BB' and line AA' in FIG. 3A according to some exemplary embodiments of the present disclosure, respectively.

As shown in FIG. 5A, the first lines 211 are arranged on a side of a first insulating layer I1 away from the base substrate 4. The orthographic projections of the first lines 211 located in the first wiring area A1 on the base substrate 4 are arranged at intervals of a first distance D1. As shown in FIG. 5B, the second lines 212 are arranged on a side of the first insulating layer I1 away from the base substrate 4, and the third lines 213 are arranged on a side of a second insulating layer I2 away from the base substrate 4. The second lines 212 and the third lines 213 located in the second line area A2 are alternately arranged in different layers. The orthographic projections of the second line 212 and the third line 213 on the base substrate 4 are arranged at intervals of a second distance D2. In the embodiments, the first distance D1 is greater than the second distance D2.

In some embodiments, at least two functional devices are arranged in the first hole 11 to effectively break through the existing design of regular-shaped holes. In the embodiments, the functional devices include a camera or a sensor, that is, one camera and one sensor, or one camera and multiple sensors, or multiple cameras, or multiple sensors are arranged in the first hole 11.

In some embodiments, at least one functional device is arranged in the second hole 12.

In some embodiments, since different sensors or cameras have different device sizes, the edge of the first hole 11 may be designed according to the actual device sizes of the cameras and sensors, and the inner diameters of the first hole 11 corresponding to the cameras or sensors are different, so as to change the safe distance reserved in the existing frame area, that is, change the size of the frame area unified by the camera and the sensor.

In the embodiments, the first hole 11 includes a stepped portion 14 provided on an edge of the first hole in the long axis direction as shown in FIG. 2. The inner diameter d in the first hole 11 is set according to the specific size of the camera or sensor, so the edge of the first hole 11 is a closed arc with steps, thereby effectively reducing the size of the frame area. That is to say, in the embodiments, irregular-shaped holes with different inner diameters are provided in the short axis direction according to the actual size of each functional device, which effectively reduces the size of the frame area and increases the screen ratio of the display device.

In some embodiments, the first hole 11 has an arc portion and a rectangular portion. Due to the different sizes of the cameras and the sensors, the inner diameters of the irregular-shaped holes provided according to the size of the camera and the sensor are different. If the size of the camera or the sensor in the arc portion is small, the inner diameter of the arc portion is small. If the size of the camera or the sensor in the rectangular portion is large, the internal diameter d of the rectangular portion is large. The inner diameter of the arc portion is smaller than the inner diameter of the rectangular portion, which can effectively reduce the size of the frame area.

According to the above-mentioned racetrack hole portion of the array substrate, especially the racetrack hole portion including the first wiring area and the second wiring area provided in sub-areas of the racetrack hole portion, each signal can be effectively transmitted safely, stably and accurately, while reducing the size of the frame area and improving the display effect and product yield of the display device.

In some embodiments, the display device includes the above-mentioned array substrate or some functional devices. The display device may be any product or part with a display function such as a mobile phone, a tablet computer, a TV, a display, a notebook computer, a digital photo frame and a navigator.

In view of the current problems, the present disclosure provides an array substrate and a display device. The racetrack hole portion including irregular-shaped holes is compatible with functional devices of different sizes, which can effectively reducing the size of the frame area, increasing the screen ratio of the display device and bringing broad application prospects.

Obviously, the above-mentioned embodiments of the present disclosure are only examples for clearly explaining the present disclosure, rather than limiting the embodiments of the present disclosure. For those of ordinary skill in the art, they can also do some other different forms of changes or modifications on the basis of the above-mentioned description. It is not possible to exhaustively list all the implementations. Any obvious changes or modifications derived from the technical solutions of the present disclosure are still within the protection scope of the present disclosure.

What is claimed is:

1. An array substrate, comprising:
   a base substrate comprising a display area; and
   a racetrack hole portion in the display area, comprising:
      a long axis;
      a short axis;
      a first hole and a second hole spaced apart in a long axis direction of the racetrack hole portion;
      a frame area surrounding the first hole and the second hole; and
      multiple lines in the frame area,
   wherein an orthographic projection of a combination of the first hole, the second hole, and the frame area on the base substrate has a racetrack shape;
   wherein the frame area comprises a first wiring area and a second wiring area, a width of the first wiring area in the long axis direction of the racetrack hole portion being greater than a width of the second wiring area in the long axis direction of the racetrack hole;

wherein the first wiring area comprises a first conductive layer, and a plurality of lines located in the first wiring area are arranged in the first conductive layer;

wherein the second wiring area comprises a second conductive layer and a third conductive layer which are arranged in different layers, and a first part of a plurality of lines located in the second wiring area are arranged in the second conductive layer, and a second part of the plurality of lines located in the second wiring area are arranged in the third conductive layer;

wherein the first hole is an irregular-shaped hole and the second hole is a regular-shaped hole, wherein the first hole is configured to receive at least two functional devices, and inner diameters of the first hole corresponding to the at least two functional devices are different in a short axis direction;

wherein the frame area comprises: a first frame area on a side of the first hole away from the second hole; a second frame area between the first hole and the second hole; and a third frame area on a side of the second hole away from the first hole;

wherein the irregular-shaped hole comprises an arc portion and a rectangular portion, wherein the arc portion is located on a side of the rectangular portion rectangular portion away from the second frame area along the long axis direction, and an inner diameter of the arc portion is smaller than an inner diameter of the rectangular portion in the short axis direction;

wherein the second wiring area is located in the second frame area; and wherein orthographic projections of the plurality of lines located in the first wiring area on the base substrate are spaced apart from each other by a first distance; orthographic projections of the plurality of lines located in the second wiring area on the base substrate are spaced apart from each other by a second distance; and the first distance is greater than the second distance.

2. The array substrate according to claim 1, wherein: the first wiring area is located in the first frame area; or the second wiring area is located in each of the first frame area and the second frame area.

3. The array substrate according to claim 1, wherein the first wiring area or the second wiring area is further located in the third frame area.

4. The array substrate according to claim 1, further comprising a plurality of pixel units in the display area, wherein the plurality of pixel units comprise thin film transistors, each of the thin film transistors comprising an active layer, a gate electrode, a source electrode, and a drain electrode.

5. The array substrate according to claim 4, wherein the first conductive layer is located on a same layer as the gate electrode, and the second conductive layer is located on a same layer as the source electrode and the drain electrode.

6. The array substrate according to claim 5, wherein a material of the third conductive layer is the same as a material of the source electrode and the drain electrode.

7. The array substrate according to claim 4, wherein the first conductive layer is located on a same layer as the source electrode and the drain electrode, and the second conductive layer is located on a same layer as the gate electrode.

8. The array substrate according to claim 7, wherein a material of the third conductive layer is the same as a material of the gate electrode.

9. The array substrate according to claim 1, wherein a plurality of lines arranged in the second conductive layer and a plurality of lines arranged in the third conductive layer are alternately arranged.

10. The array substrate according to claim 1, wherein the first hole comprises a stepped portion on an edge of the first hole in the long axis direction.

11. A display device comprising the array substrate according to claim 1.

12. The display device according to claim 11, further comprising one or more functional devices, wherein the functional devices comprise a camera or a sensor, and an orthographic projection of the functional devices on the base substrate falls into an orthographic projection of the racetrack hole portion on the base substrate.

13. The display device according to claim 11, wherein at least two functional devices are arranged in the first hole, and at least one functional device is arranged in the second hole.

* * * * *